United States Patent [19]

Cotterell et al.

[11] Patent Number: 4,839,601
[45] Date of Patent: Jun. 13, 1989

[54] DIRECTIONAL CURRENT FINDER

[76] Inventors: Daniel E. C. Cotterell, 2150 Bromsgrove Road, Mississauga, Ontario, Canada, L5J 4B3; David J. Stewart, P.O. Box No. 4, R.R. #2, Loretto, Ontario, Canada, L0G 1L0

[21] Appl. No.: 127,040

[22] Filed: Nov. 27, 1987

Related U.S. Application Data

[63] Continuation-in-part of Ser. No. 746,888, Jun. 20, 1985, abandoned.

[51] Int. Cl.$^4$ ............................................. G01R 31/16
[52] U.S. Cl. .................................... 324/559; 324/528; 340/604
[58] Field of Search ............... 324/557, 558, 559, 528, 324/525, 527, 512, 65 R, 65 P, 64, 357, 358, 354, 523; 340/604; 73/155

[56] References Cited

U.S. PATENT DOCUMENTS

| | | | |
|---|---|---|---|
| 2,978,637 | 4/1961 | Price et al. | 324/559 |
| 3,106,677 | 10/1963 | Edgar | 324/559 |
| 3,210,655 | 10/1967 | McGlasson et al. | 324/559 |
| 3,303,418 | 2/1967 | Rose | 324/64 |
| 3,383,863 | 5/1968 | Berry | 405/270 |
| 3,496,768 | 2/1970 | Boucher | 73/155 |
| 3,500,188 | 3/1970 | Whitley | 324/64 |
| 4,101,827 | 7/1978 | Offner | 324/65 R |
| 4,166,244 | 8/1979 | Woods et al. | 324/65 R |
| 4,357,573 | 11/1982 | Heuze | 324/559 |
| 4,404,516 | 9/1983 | Johnson, Jr. | 324/557 |
| 4,543,525 | 9/1985 | Boryta et al. | 324/559 |

OTHER PUBLICATIONS

Schultz et al, Electrical Resistivity Technique to Assess the Integrity of Geomembrane Liners, Aug. 1, 1984, pp. 1-63.

Primary Examiner—Reinhard J. Eisenzopf
Assistant Examiner—Robert W. Mueller
Attorney, Agent, or Firm—Wegner & Bretschneider

[57] ABSTRACT

An electrical detection system for locating a position of interest in a medium which is electrically conductive includes a signal generator, a source, a sink and at least two probes. The probes are disposed in the medium equidistantly spaced from either the sink or the source. A signal generated by the generator flow from the sink and to the source and will also flow to the probes. The probes are connected to input terminals of a comparator to thereby compare the signal strengths at the probes. The probes are movable to different positions in the medium to determine a cross-over position such that, at the cross-over position, the perpendicular bi-sector of the line joining the probes indicates the point of interest by pointing in the general direction thereof.

15 Claims, 10 Drawing Sheets

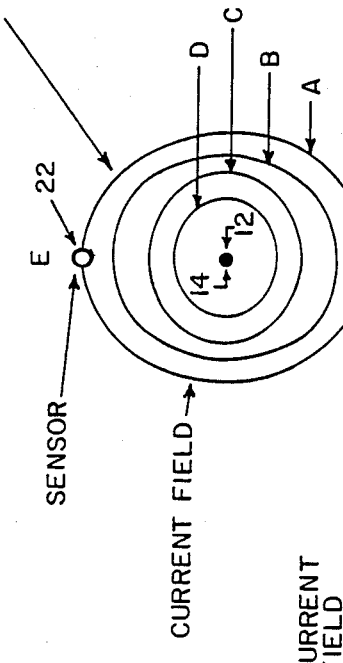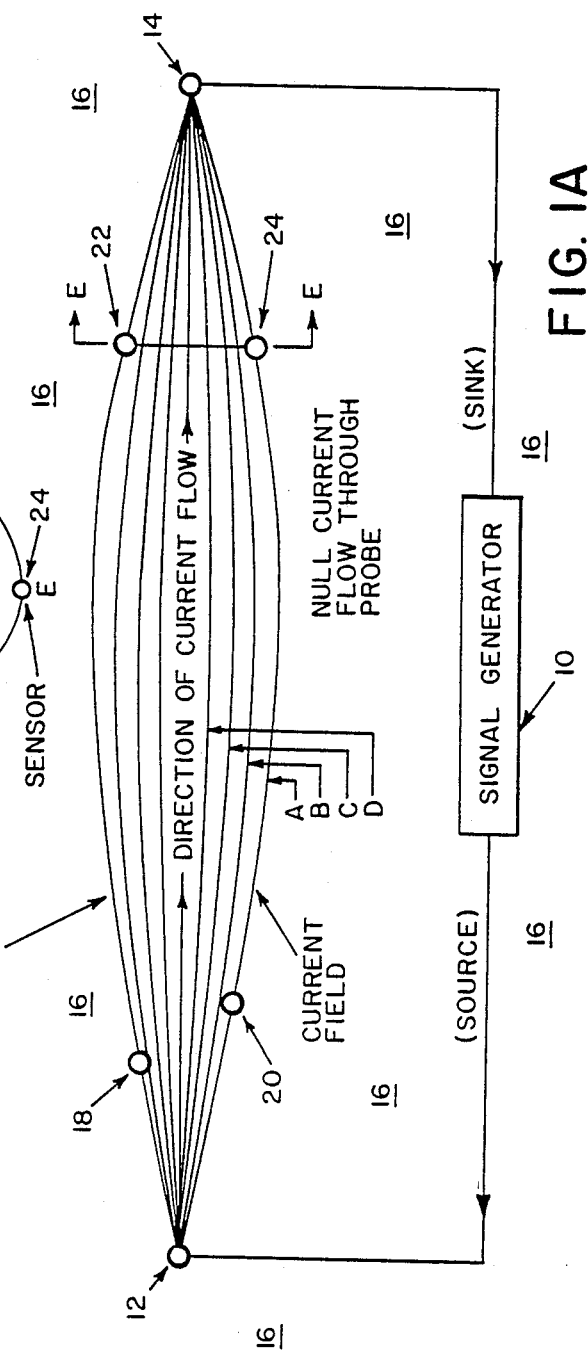

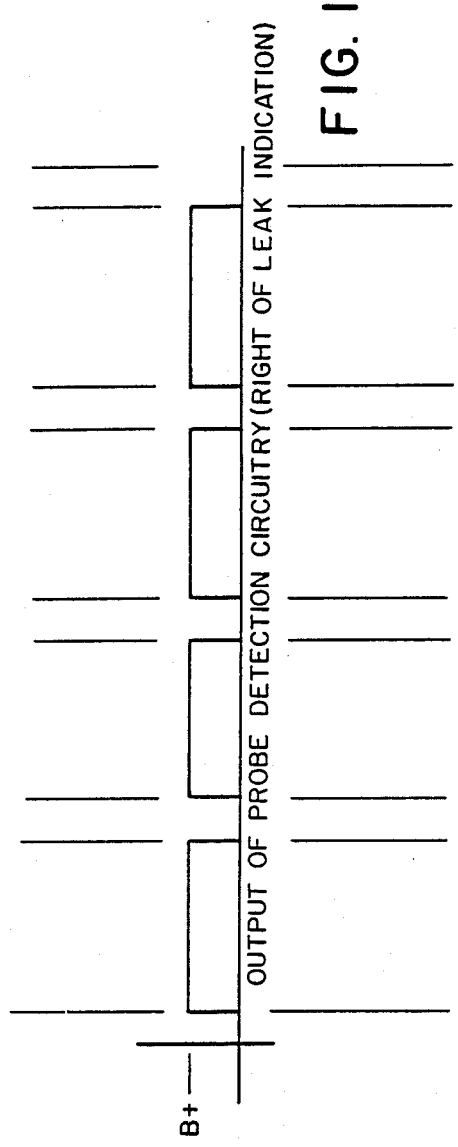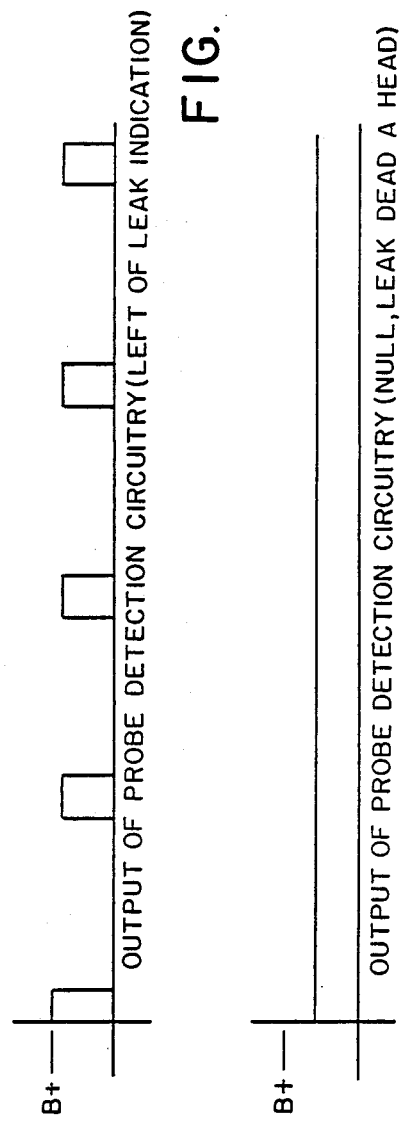

DIRECTIONAL CURRENT FINDER

CROSS REFERENCE TO RELATED APPLICATION

This is a continuation-in-part application of parent application Ser. No. 746,888, filed June 20, 1985 now abandoned.

BACKGROUND OF THE INVENTION

1. Field of the Invention

The invention also relates to an electrical detection system for detecting a position of interest in a conductive medium. The invention also relates to a method for detecting the position of interest with the inventive detection system.

2. Description of Prior Art

In the past, it has been possible to determine the existance of an electrical signal. However, the determination of the direction of the source of the signal is difficult, particularly when the strength of the signal is low, or if more than one source exists.

SUMMARY OF THE INVENTION

An electrical detection system for locating a position of interest in a medium which is electrically conductive includes a signal generator, a source, a sink and at least two probes. The probes are disposed in the medium equidistantly spaced from either the sink or the source. A signal generated by the generator flow from the sink and to the source and will also flow to the probes. The probes are connected to input terminals of a probes. The probes are movable to different positions in the medium to determine a cross-over position such that, at the cross-over position, the perpendicular bi-sector of the line joining the probes indicates the point of interest by pointing in the general direction thereof.

BRIEF DESCRIPTION OF DRAWINGS

The invention will be better understood by an examination of the following description, together with the accompanying drawings, in which:

FIG. 1A is a schematic illustration of the inventive system;

FIG. 1B is a cross-section through E—E of FIG. 1A;

FIGS. 13A, 13B and 13C illustrate outputs of the comparator under different conditions.

DESCRIPTION OF PREFERRED EMBODIMENTS

Figure 1:
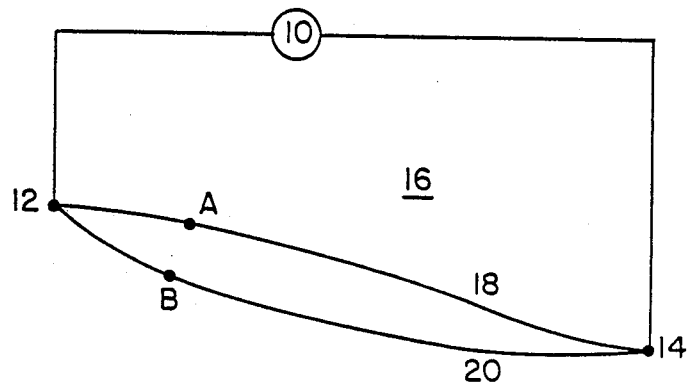
FIG. 1 shows a system of the invention.

Referring to the drawings, FIGS. 1, 1A and 1B schematically illustrates an embodiment of the inventive system.

The embodiment includes a generator 10, a source 12 and a sink 14. The generator 10 is any generating means which is capable of generating a suitable signal. The generator 10 is connected electrically to a source 12.

The source 12 is any suitable means from which the signal can be emanated or transmitted through the conductive medium (e.g. water, ground) 16 from the source 12 to the sink 14.

The sink 14 is any suitable means which can receive the electrical signal after it has been transmitted from the source 12 and after it has passed through the medium 16. The sink 14 is connected electrically to the generator 10, but it is not normally connected electrically to the source 12. The electrical connection between the source 12 and the sink 14 is obtained through the medium 16. Thus, if the medium 16 is one which permits a suitable signal to pass therethrough, a suitable signal generated from the signal generator 10 will pass through the medium 16 from source 12 to sink 14. However, if the medium 16 is one that does not permit the signal to pass, (i.e. an insulator or non-conductive material) there will be no electrical connection between the source 12 and the sink 14, and the signal will not pass therebetween. Accordingly, if the medium 16 is one which permits a suitable signal to pass therethrough, the electrical circuit from the generator 10, to the source 12, to the sink 14 and to the generator 10 will be completed between the source 12 and the sink 14 by the path which the signal takes from the source 12 to the sink 14 through the medium 16.

It has been discovered that the signal usually takes more than one path through the medium 16 from the source 12 to the sink 14. It is believed that each of these several paths which are of the same length has the same total resistance from source 12 to sink 14. Some paths (of different lengths) of the signal in medium 16 are shown in FIGS. 1A and 1B at A,B,C and D.

It will be understood that, in one sense, the source 12 is different than the sink 14, in that the signal emanates from the former and is received by the latter. However, the source 12 and the sink 14 can be considered to be equivalent if only the presence of a path which the signal takes between the source 12 and sink 14 is considered. Thus, theoretically the system is capable of detecting a position of interest at either the source 12 or the sink 14. Accordingly, when the term "source" is referred to in the sense of detecting the position of interest, it will be understood that "source" can mean either a source or a sink.

It has been discovered that the position of interest can be determined if at least two points are found in the medium 16 for which the strengths of the signals at those points are the same and if those points are equidistant from either the sink 14, or from the source 12. It has been found that the position of interest lies in the direction of the bi-sector of the line which joins the two points where the strengths of the signals are equal.

Although the precise reason for this phenomenon is not completely understood, it is believed that the strength of the signal detected at any given point on a path of the signal through the medium 16 depends on the ratio of the electrical resistance of the medium 16 between the source 12 and the point to the electrical resistance of the medium 16 between the point and the sink 14. This ratio will be referred to as the resistance ratio.

It is further believed that the resistance of a medium over a given path is primarily dependent upon the electrical resistivity of the medium and the length of the path through the medium. Thus, if the resistivity of the medium is uniform or approximately uniform throughout the medium, the resistance ratio reduces to a distance ratio. The distance ratio is the length of the path from the source to the point to the length of the path from the point to the sink.

Thus, if the strength of the signal at a point on the path, say point 18 on path A, is equal to the strength of the signal at a different point on a different path, say point 20 on path B, the respective distance ratios respecting those points should be equal. Now, if it is known that the lengths of the paths from the source 12 to the respective points are equal, the lengths of the paths from the sink to the respective points must also be equal. Similarly, if the lengths of the paths from the sink 14 to the respective points are equal, the lengths of the paths from the source 12 to the respective points must also be equal.

Figure 2:
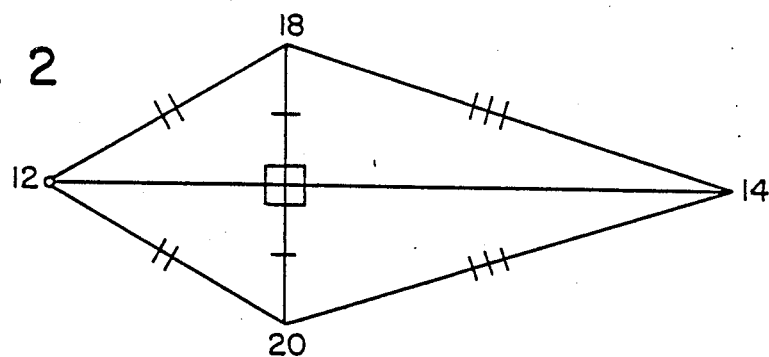
FIG. 2 shows some geometrical principles of the invention.

Thus, for the cases as described above, by the geometrical relationships as shown in FIG. 2, it is determined that the direction of the source 12 or the sink 14 lies in the direction of the bi-sector of the line that joins the points 18 and 20.

If the lengths of the paths from the respective points of equal signal strength to either the source 12 or the sink 14 are not exactly equal, it has been found that the bi-sector of the line joining the points indicates approximately the direction of the source 12 or the sink 14.

This principle is used in the unique detection system to locate a position of interest in a conductive medium. In its most basic form, the device comprises three elements: a receiving means; a comparing means; and an indicating means.

The receiving means comprises at least two separate means for receiving or detecting the electrical signal in the medium. Preferably, the receiving means are electrical probes.

In an example of the detecting system, we will assume that we are looking for a break in the insulative lining of a below ground swimming pool. Both the water in the pool and the ground surrounding the pool are conductive mediums. If we locate the source (or sink) in the water of the pool, and the sink (or source) in the surrounding ground, then a conductive path exists between the source and the sink through the break in the pool. The source and the sink will, of course, have been placed on either side of one wall of the pool.

We can now locate probes either in the water of the pool between the source and the one wall or in the ground between the sink and the one wall. Assuming the latter case, because of the conductivity of the water, the source and the break are at the same point electrically so that the break, that is, the position of interest, can be considered a secondary source. We will therefore have a plurality of paths, similar to those between 12 and 14 in FIG. 1A, extending between the point of interest (the break in the pool) and the sink. In a like manner, the break can be considered a secondary sink.

By now manipulating the probes, as will be discussed below, the position of interest can be located. The probes can be of any form which is suitable for the particular application, for example, long, slender rods for penetrating the earth.

The probes need not be fixed in any special relationship but they can be fixed in a spatial relationship to each other, such as on a frame. It will be understood that to obtain suitable results, the probes should be used to detect the signal at points having a spatial separation.

The comparing means is any means which can be used for comparing the strength of the electrical signal received at the first probe to the strength of the signal received at the second probe. Ideally, it is desired to determine when the strengths of the signals received at the two probes are equal. Ideally, this can be accomplished by using a "null" circuit. However, it has been discovered that it is quite difficult in practice to implement a "null" circuit which accurately determines the "null" point. Accordingly, the invention provides for the use of a "cross-over" circuit. That is, rather than determining when the strengths of the detected signal are equal, it is determined when the difference between the signals detected at the two probes changes from positive to negative, or vice versa, i.e., when the signal strengths of the probes change from inequality in a first sense to inequality in a second sense. In other words, this embodiment of the invention determines when the strength of the signal received at one probe becomes greater than or lesser than the strength of the signal received at the other probe.

It is possible to make such a determination as discussed above in some instances when the signal is a direct current signal. However, it has been found that as the strength of the direct current signal becomes low, it becomes very difficult to accurately determine the strength of the signal. It is believed that this is due to the direct current, galvanic potentials developed due to the dissimilarities between the probe and the surrounding medium.

In order to overcome this problem, it has been discovered that if the signal has a pulsed, asymmetric waveform, suitable electronic circuitry can be built which permits detection of the signal at signal strengths much lower than acceptable signal strengths for direct current signals. For present purposes, a signal having a pulsed, asymmetric waveform is one that has a non-zero average value over one period.

Figure 3:
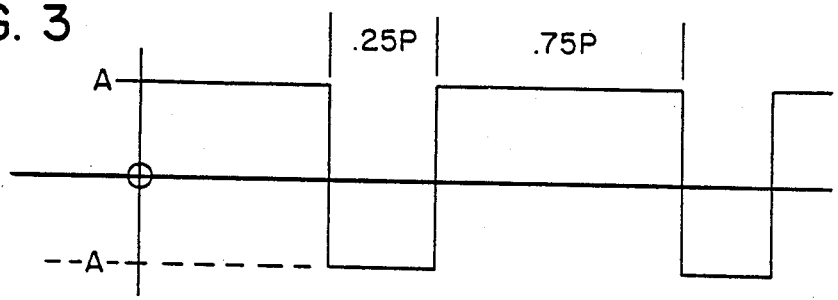
FIG. 3 shows a preferred signal of the invention.

One preferred waveform is a pulsed, asymmetric, rectangular waveform. A representative example of this type of waveform is shown in FIG. 3.

It is possible to use signals having a pulsed, symmetric waveform, but the electronic circuitry necessary to successfully compare the strengths of the signals at the different probes, requires synchronization. This increases the complexity and cost of the circuitry.

It has been found that it is relatively easy to amplify and limit as many times as is required to practically obtain a suitable signal when the signal has a rectangular, pulsed, asymmetric waveform. When such a signal has been detected and suitably amplified, the average value of the detected signal can be determined. The average value of the signal is a non-zero value because the signal has a pulsed, asymmetric waveform.

Accordingly, the non-zero average value of the signal detected at the two probes can be compared as discussed above to determine when the strength of the signal detected at one probe becomes either greater than or lesser than the strengths of the signal detected at the other probe.

Figure 4:
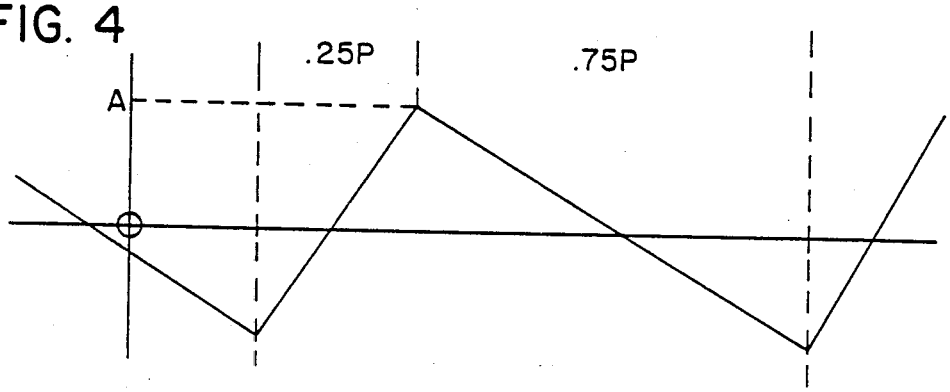
FIG. 4 shows another preferred signal of the invention.

It has been found that signals having a pulsed, asymmetric, rectangular waveform are suitable when the frequency of the signal is considerably greater than 300 Hertz. However when the frequency of the signal is around 300 Hertz, it has been found that better performance can be obtained when the signal has a ramp-like pulsed, asymmetric waveform such as is shown in FIG. 4.

If a signal having a ramp-like, pulsed, asymmetric waveform is used, the probes detect this type of signal but the signal is passed through a transforming means before the strengths of the signals are compared. The transforming means transforms the signal having a ramp-like, pulsed, asymmetric waveform into a signal having a rectangular, pulsed, asymmetric waveform. The transformed signal can thus be suitably and easily amplified and limited. The transforming means can be a transformer.

The device of the invention includes some indicating means which indicates when the strength of the signal received at one probe becomes either greater than or lesser than the strength of the signal received at the other probe. It is possible to have any sort of indicating means such as a light or a dial. However, a preferred indicating means will produce an aural stimulus. The aural stimulus could be an audible beeping or buzzing sound. It will be apparent to a person skilled in the art how to provide and produce a suitable indicating means.

Figure 5:
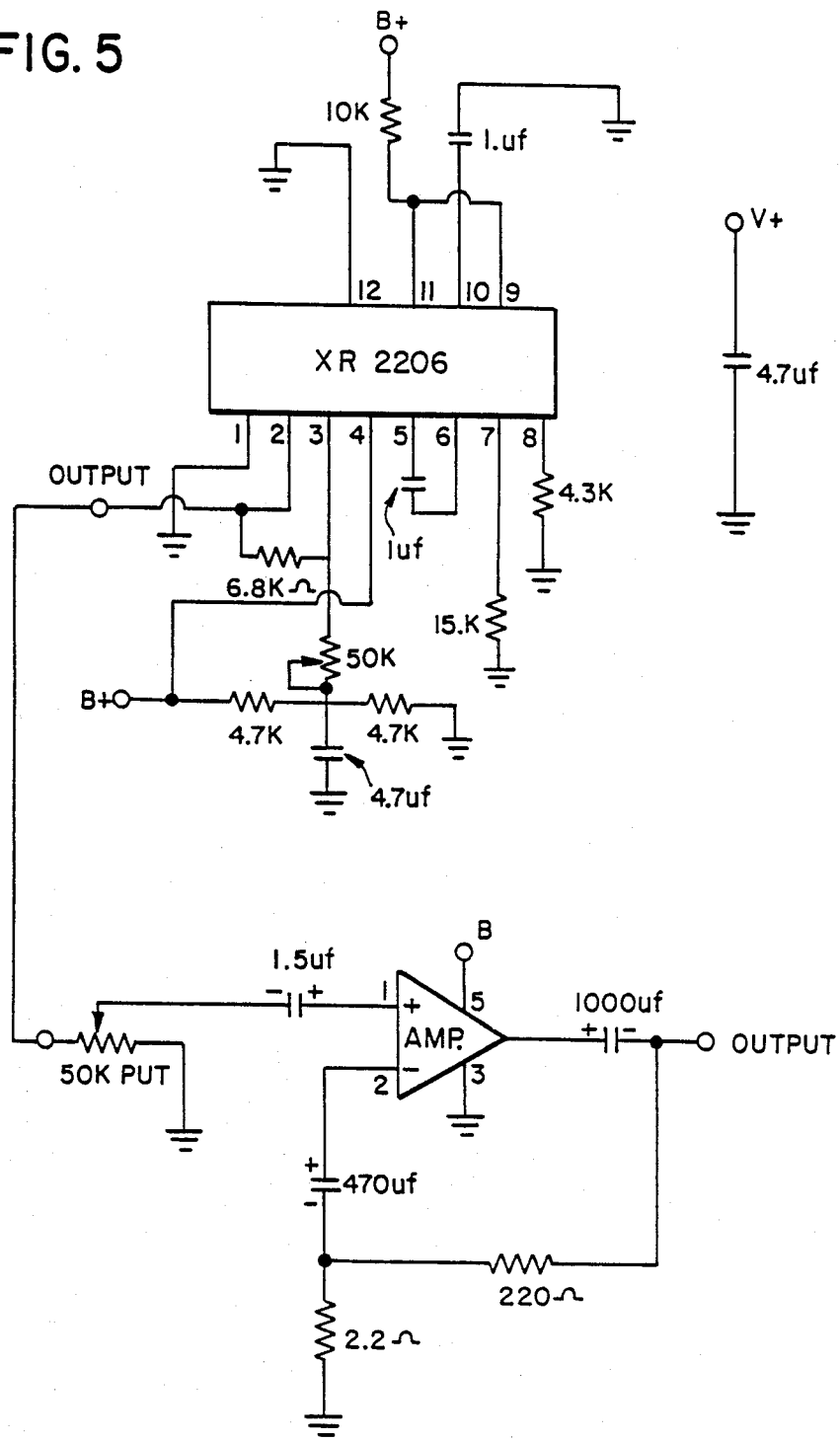
FIG. 5 shows a circuit diagram of a transmitter (Signal Generator)
Figure 6:
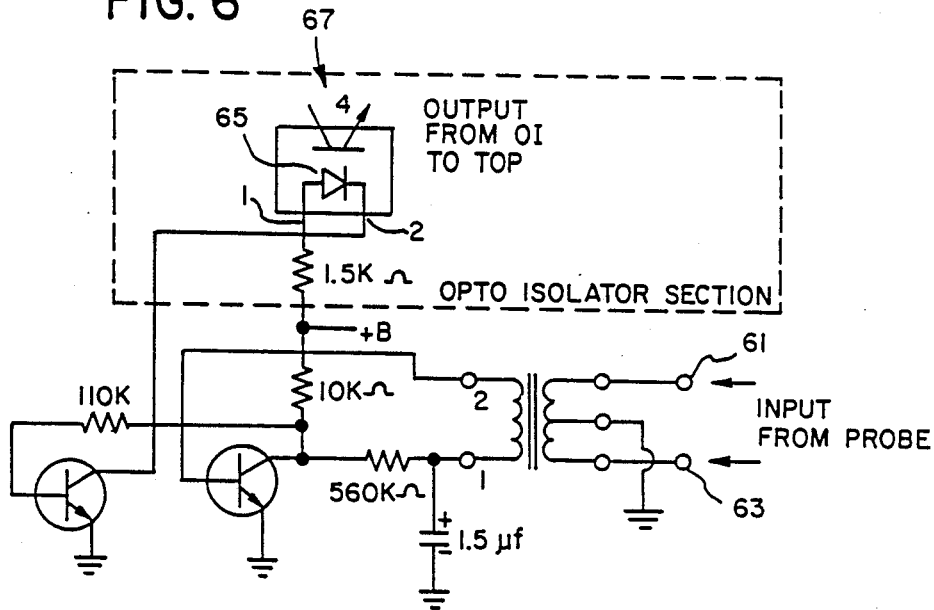
FIG. 6 illustrates one embodiment of a comparator circuit useful in the inventive system.
Figure 7:
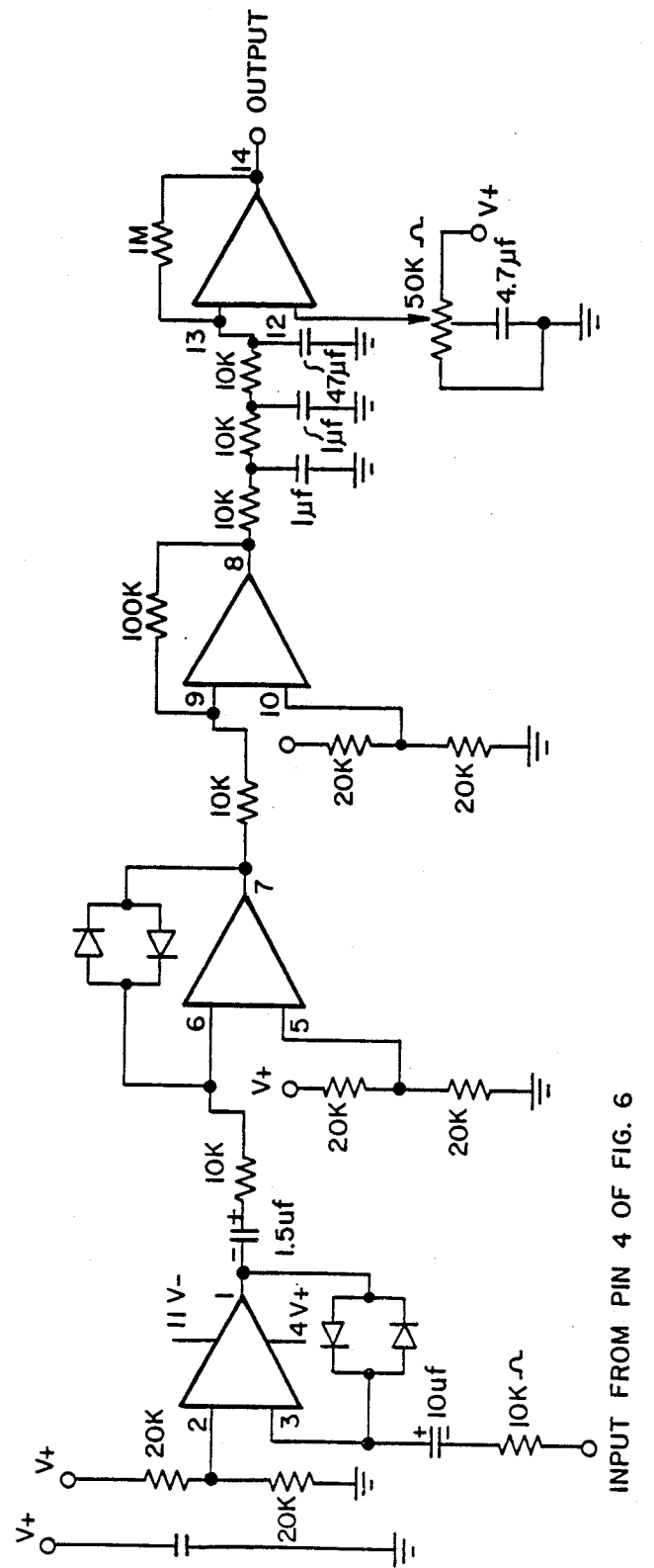
FIG. 7 is an amplifier circuit for the output of the comparator of FIG. 6.

Preferred electrical circuits respecting certain aspects of the above-described device are shown in FIGS. 5, 6 and 7. FIG. 5 shows a combined generator and source; FIG. 6 shows a portion of a preferred detecting circuit; and FIG. 7 shows further portions of a preferred detecting circuit.

Referring to FIG. 5, XR2206 is an integrated circuit chip which will produce the waveform of FIG. 4 with the external circuitry connected as shown in FIG. 5. The resistors at pins 7 and 8 and the capacitor at pins 5 and 6 determine the frequency of operation of the transmitter.

Referring to FIG. 6, input from a sensor A is fed to terminal 61 and an input from sensor B is fed to terminal 63. As mentioned above, when the triangular wave is fed through the transformer, it will be truncated so that it is substantially in the form of a rectangular wave.

When the input of sensor A is stronger than the input of sensor B, then a long pulse is produced as shown in FIG. 13A. When the input at sensor B is stronger, then the output is a short pulse as shown in FIG. 13B. When the strength on both center A and center B are equal, then the output is a constant value as illustrated in FIG. 13C.

The output signal is optically coupled to an amplifier via LED 65 and phototransister 67. Pin 4 of the phototransister is coupled to the input of the amplifier circuit illustrated in FIG. 7. FIG. 7 illustrates a four-stage amplifier for amplifying the relatively small output of the optical coupler.

The output 14 of the amplifier in FIG. 7 is coupled to either an indicating device (a meter or the like) or a device for producing an audio signal as is well known in the art.

During operation, the detecting system of this invention is used as follows with reference to FIG. 1A. A signal generator 10 is used to generate a suitable electrical signal as discussed above. The generator 10 is connected electrically to at least one transmitter or source 12. The generator 10 is also electrically connected to a sink 14. The source 12 and the sink 14 are not normally electrically connected.

The source and the sink 14 are positioned in the medium 16, and the circuit between 12 and 14 is completed by the conductive medium 16. A suitable signal is generated in the generator 10 and it is transmitted from the source 12. If the medium 16 is such as to permit the signal to pass, the signal will pass to the sink 14 via several paths in the medium 16.

At least one set of sensors 22 and 24, which may comprise probes, of the detecting system is placed into the medium 16, each sensor 22 or 24 being placed at spatially-separated locations in the medium 16 such that the probes are equidistantly spaced from either the sink or the source.

A signal is detected by each probe at its res location. The strengths of the signals detected at their locations are then compared. If the strengths are equal, then the perpendicular bisector of the line joining the probes points at both the source or the sink. For simplification, it has been assumed that either the source or the sink in FIG. 1A is a secondary source or sink as above described.

In the remainder of the description, it will be assumed that the source is a secondary source (the position of interest) and that the sink is the primary sink. accordingly, the probes will be placed at equal distance from the sink as the position of the secondary source is not known.

If the strengths of the signals are not equal, then the spacial position of at least one of the probes is altered ensuring that the spacing between the altered probe and the sink is and remains the same as the distance between the unmoved probe and the sink. When the strengths on the probes are unequal, then the signal strength on one probe is greater than the signal strength on the other probe. The one probe is moved until such time as the signal strength on the other probe is greater than the signal strength on the one probe. With reference to FIGS. 13A and 13B, the probe is moved until the output of the comparator changes from a long pulse (FIG. 13A) to a short pulse (FIG. 13B) or vice versa. When this occurs, then cross-over has been achieved. The position of interest can now be located by drawing the perpendicular bisector of the line joining the final positions of the two probes. The perpendicular bi-sector will indicate the position of interest by pointing in the general direction of the position of interest.

In the event that in one of the movements of the movable probe a signal corresponding to that of 13C is obtained, is of course not necessary to make any further moves as such a signal indicates equality of signal strength on both probes.

If the probes are joined together in a frame, then it becomes necessary to move both probes at the same time. The probes are basically moved on the periphery of a circle whose center is the sink. Thus, the distance of both probes is maintained equal from the sink at all times.

As in the above procedure, initially, a condition will exist wherein the signal strength on one probe is different from the signal strength of the other probe in a first sense. The probes are moved around until the signal strength on the one probe is different from the signal strength on the other probe in the opposite sense. (The cross-over position) (Or until the signal strengths on both probes are equal). When this latter condition is obtained, the perpendicular bi-sector of the line joining the probes will point in the general direction of the position of interest.

It will be understood that the detecting system is not limited to only one set of proves and that each set of probes is not limited to only two sensors. In different situations, a different number of sets of sensors and a different number of probes comprising each set could be used.

Figure 8:
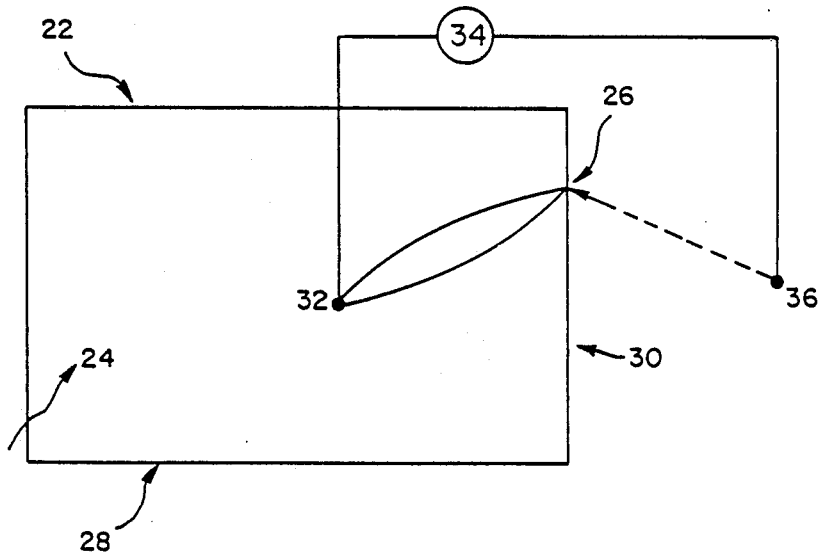
FIG. 8 shows an application of the invention respecting a reservoir.

One application of the invention is in finding the location of a "leak" in certain materials. With reference to FIG. 8, there are many situations where a reservoir 22 for containing a fluid 24 or other suitable material develops a leak or opening 26 in the fluid impervious barrier 28 of reservoir 22. If the reservoir 22 is surrounded by another material 30, such as when the reservoir 22 is completely or partially underground and therefore surrounded by earth, it is difficult to detect the location of the opening 26 where the fluid 24 is escaping. If the barrier 28 is a non-conductive material and the fluid 24 or other suitable material is conductive, the location of the opening 26 can be located as described below. If the surrounding material 30 is non conductive, it is necessary for the fluid 24 which has escaped from the reservoir 22 to spread out from the opening 26 to form an electrical path between the sink 36 and the opening 26.

A source such as a transmitter 32 is placed inside the reservoir 22 and is electrically connected to a generator 34 which is capable of generating a signal suitable for this invention. The generator 34 is also electrically connected to a sink such as a ground rod 36 which is placed outside of the reservoir 22.

If there is no leak or opening 26 in the barrier 28, there will be no electrical path along which the signal can travel from the transmitter 32 to the ground rod 34 because the barrier 28 does not permit the signal to pass therethrough. However, if there is an opening 26 in the barrier 28, the signal will pass through the barrier 28 at opening 26, and if the surrounding material 30 is conductive (or becomes conductive due to fluid saturation) there is a conductive path between the opening 26 and the ground rod 36.

In any case, because the signal will pass only through the opening 26, the opening 26 acts as a secondary or local sink for the signal. Therefore, if the probes are placed in the reservoir 22 between the transmitter 32 and the opening 26, it is possible to determine the location of the opening 26 as explained above. Each time the indicating means of the detecting system indicates that the bisector of the line joining the two probes points at the opening 26, the operator knows in which direction he should advance in order to locate the opening 26.

The invention is particularly suitable for finding leaks in swimming pools. It has been found that the invention is more useful when the sides of the swimming pool are made of some sort of plastic rather than porous concrete blocks. However, even when the sides of the swimming pool are porous concrete blocks, the invention is useful for detecting larger holes.

Figure 14:
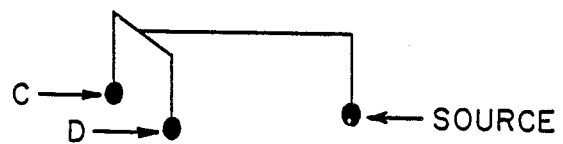
FIGS. 14, 15 and 16 illustrate different embodiments of the probes.

In further embodiments of the invention that are useful in locating leaks in a reservoir, the probes may be permanently spaced apart so as to have fixed spacing as seen in FIG. 14. A suitable spacing has been found to be about 8 inches.

Figure 15:
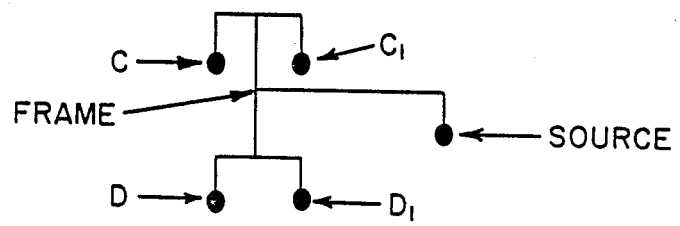

In another embodiment, illustrated in FIG. 15, there are two independent sets of probes with two probes in each set. Once again, the probes of each set may be permanently spaced apart. Also, a separate aural or visual stimulus can be used to indicate alignment respecting each set of probes, such as different tones of buzzes or beeps.

Figure 16:
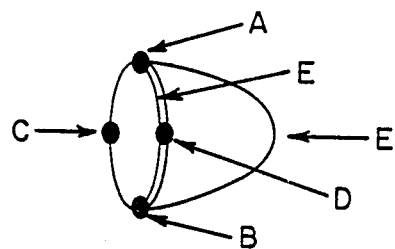

Also, the two sets of probes may be aligned substantially orthogonally with respect to each other as in FIG. 16. For instance, there could be an up/down pair of probes and a right/left pair of probes. Accordingly, one pair of probes would determine the direction of the source in the up/down plane and the other pair of probes would determine the direction of the source in the right/left plane.

If the probes are spaced apart, it is convenient to position the probes on a frame which is readily moved by the operator.

In a further embodiment, it is possible to have an effective source which comprises more than one actual source. For example, there could be four actual sources or transmitters. In this embodiment, each transmitter is mounted on the rearward portion of the frame such that the distance between one transmitter and an associated probe is the same as the distance between each other transmitter and its associated probe.

In a further embodiment, the effective source may comprise two actual sources which are electrically connected through a resistance means which is similar to the resistance means as discussed below with respect to probes.

Figure 9:
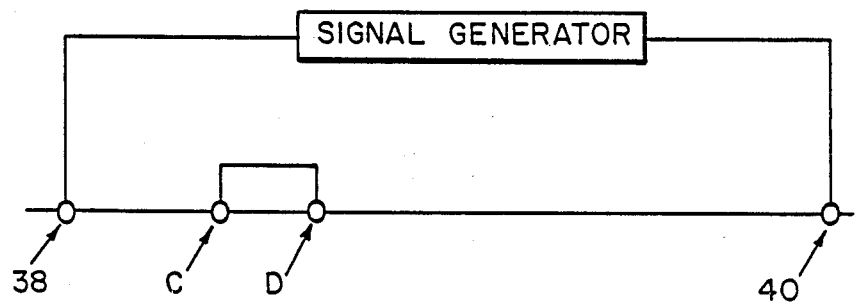
FIG. 9 is an explanatory diagram for an embodiment of the invention.

In a further embodiment, a front/back detector may be included with the detecting device. Once it is determined that the source or sink lies along the bisector of the line joining two probes, it is not necessarily known for sure whether the source or sink is actually in one direction or the other. Accordingly, with reference to FIG. 9, in order to overcome this problem, two additional probes C, D are provided which, preferably, straddle the source 38 and which form a straight line therewith. Also, the probes C, D are approximately equidistant from the source 38.

It has been found that the probe that lies in between the source 38 and the sink 40 receives the stronger signal. Therefore, if it is desired to have a probe, say probe D, always between the source 38 and the sink 40, the strength of the signal at probe D can be compared to the strength of the signal at probe C. As long as the strength of the signal at probe D is greater than the strength of the signal at probe C, the probe D is between the source 38 and sink 40 and the probes are aligned as designed.

It has been found convenient to monitor, either continuously or periodically, the difference signal of the signal detected at a front probe minus the signal detected at a rear probe. So long as this difference signal is always positive, a HI signal is produced which is used to activate other parts of the system. If the difference signal goes negative, a LO signal is produced and the other parts of the system will not work. Alternatively, a visual or aural stimulus could be used such as a light or beep to indicate a positive difference signal.

Figure 10:
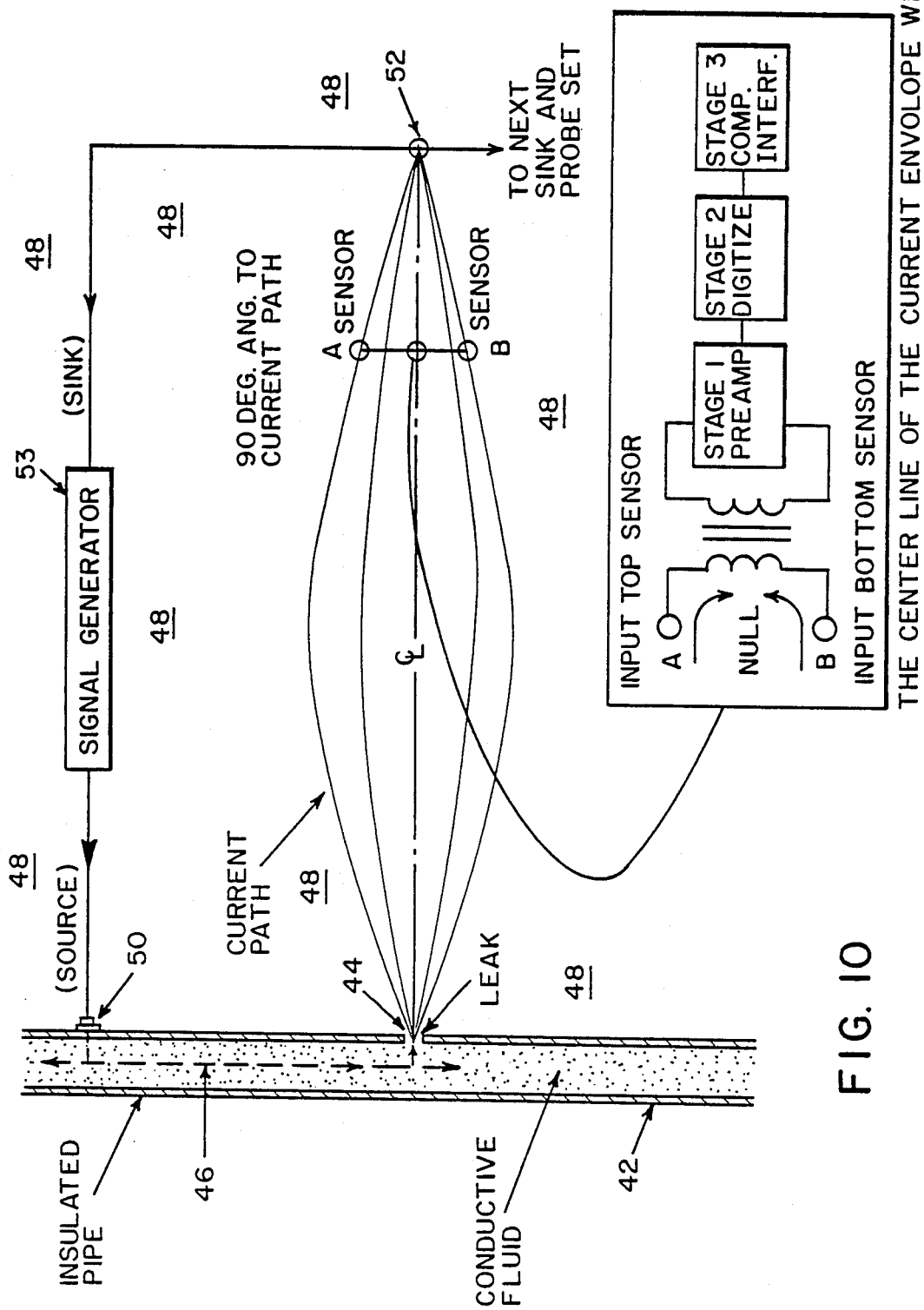
FIG. 10 shows an application of the invention respecting a pipe.

A further application of the invention is in locating holes in a pipe. Essentially, a pipe is a very elongated reservoir and so the same principles as discussed above will apply in the case of a pipe. This application is illustrated in FIG. 10 where 42 is a pipe; 44 is a hole in the pipe; 46 is a fluid or other suitable material as discussed above; 48 is a surrounding medium; 50 is a source or transmitter; 52 is a sink or ground rod; 53 is a generator; and A, B are probes FIG. 10 illustrates a cross-sectional view of the pipe 42.

Another embodiment of the invention is useful when the probes of the detecting device are to be used for an extended period of time in one location. Such a situation could arise when it is desired to monitor overtime for leaks in fluid storage reservoirs which are permanently fixed.

Figure 11:
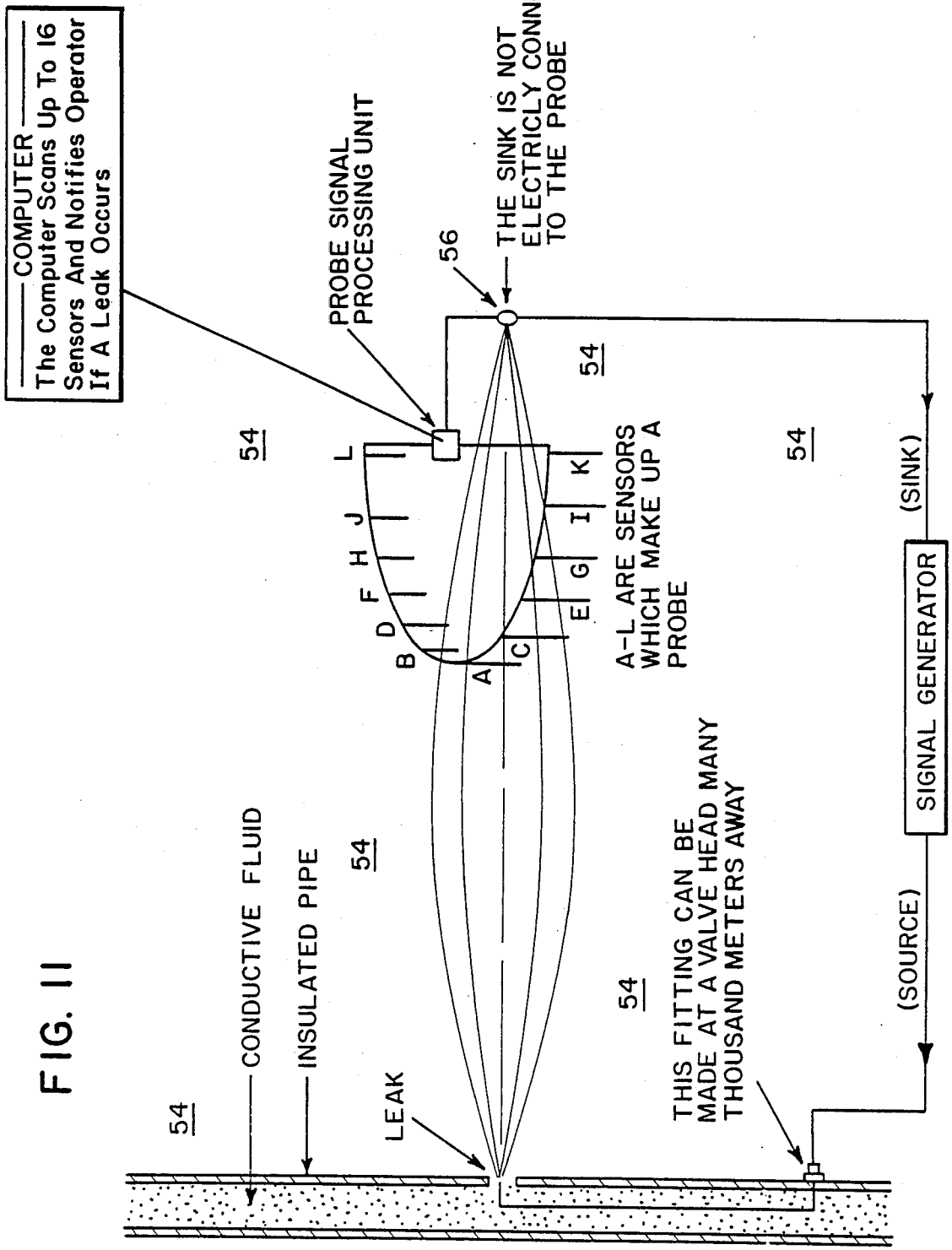
FIG. 11 shows a further embodiment of the invention.

In this embodiment, as shown in FIG. 11, a plurality of probes A, B, C, D, E, F, G, H, I, J, K and L are placed in position in the relevant medium 54 such that each probe is at an equal distance, or at least an approximately equal distance, from the source or transmitter 56. Thus, the probes are positioned in a fanshaped array along an arc or a circle of constant radius r from the transmitter. The number of probes and the spacing between the probes depends on the desired sensitivity. A suitable radius separating the probes from the transmitter 56 has been found to be about 10 feet. A suitable separation of probes along the arc or circle is about 3 feet between two probes.

The direction or directions in which this embodiment is useful depends on whether the probes are spaced all around the transmitter for 360° or for a lesser angle, for example, 180°; as shown in FIG. 11.

During use, the operator can select a first probe as a reference probe or the reference probe can be predetermined. The operator then samples at a succession of probes and compares the signal strength of each probe with the signal strength of the reference probe, one at a time, to find for which combination of probes there is a "cross-over" (the cross-over set) where the strength of the signal detected at the reference probe becomes either greater than or lesser than the signal detected at another probe. For example, with reference to FIG. 11, probe A could be selected as the reference probe and then the strengths of the signal detected at probes B, C, D are compared against the strength of the signal at probe A. If, for example, the "cross-over" occurs at probe D, the operator knows that the position of interest lies generally in the direction of the bi-sector of the line AD (the probes A and D being the cross-over set).

It is possible to use an embodiment where the probes are not equidistant from the transmitter 56 but in such an embodiment the accuracy is not as good as when the probes are equidistant from the transmitter 56.

Figure 12:
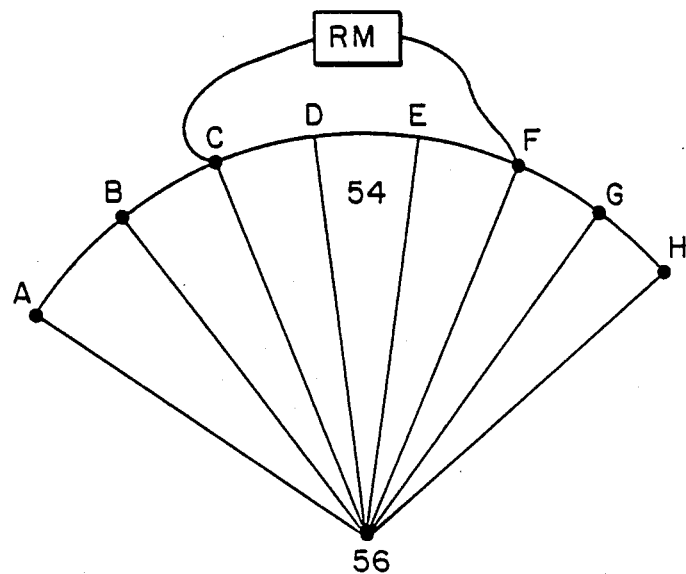
FIG. 12 shows a further embodiment of the invention.

A further embodiment of the invention comprises replacing at least some of the plurality of probes as shown in FIG. 12, by two probes that are electrically connected by some sort of resistance means. The resistance means effectively acts as an approximation of the medium 54 between the two probes.

Thus, with reference to FIG. 12, probe C and probe F are electrically connected together through a resistance means RM. If the resistivity of the medium 54 between probes C and F is approximately uniform throughout, out, the strength of the signal that would have been detected at probe D can be approximately determined by detecting the signal at an appropriate position on the resistance means RM. If the resistivity of the resistance means RM is uniform throughout, the resistance means RM should be sampled at a position along the resistance means RM which has a resistance which is proportional to the entire resistance of the resistance means RM as is the arc CD to the entire arc CF.

Any suitable resistance means can be used including a resistor or a potentiometer.

Thus, it can be seen that the strength of the signal can be at least approximately determined for any point along the arc CF and not just at the points D and E. Therefore, a greater accuracy can be obtained in determining where the "null" or "cross-over" occurs (the null or cross-over resistance). Therefore, the direction of the sink can be determined to a greater degree of accuracy.

Although it is preferred to have the resistance means approximate the points on an arc or circle of constant radius, the invention will work to varying degrees of success even when the resistance means approximates points other than those along an arc or circle of constant radius.

Many variations of the actual configurations and arrays of probes in combination with resistance means could be developed, but all such configurations and arrays would fall within the scope of the invention. For instance with reference to FIG. 12, the probe C need not be distal from the probe B. It is possible to have the probe C proximate to probe B. Alternatively, probes C and F could straddle another probe such as probe B. Moreover, there could be many probes, such as probes A and G.

In another embodiment, there could be a plurality of sources or sinks from which any particular one could be selected at any given time to reference the system.

It will, of course, be appreciated that using the cross-over position, rather than the null position, entails a degree of inaccuracy, i.e., the perpendicular bisector will only indicate the position of interest by pointing in the general direction of the position of interest rather than pointing directly at the position of interest. In some situations, this is sufficient.

In other cases, this inaccuracy is unacceptable. For example, if the probes are a long distance from the position of interest, then even a small error (1° or possibly even minutes) in the pointer (the perpendicular bisector) could lead to an unacceptably large error.

In these cases, it is necessary to either locate, or at least zero in on the null position. Locating the null position is achieved, using the crossover circuitry as follows:

Initially, the stationary probe is in a position 1, and the movable probe in position 2. The movable probe is moved to position 3 at which cross-over is achieved, i.e., the probe has passed the null position. The movable probe must, therefore, be moved back towards, but not as far as, position 2, i.e., it must be relocated between positions 2 and 3 to a position 4. At position 4, one of the following three events will occur:

(1) Null position is achieved. Thus, the perpendicular bi-sector of the line joining positions 1 and 4 will point at the point of interest.

(2) Cross-over is achieved, i.e., the probe is once again passed the position of interest.

It is therefore necessary to move the probe towards, but not as far as, position 4, to a new position 5 between positions 4 and 3. If cross-over is once achieved, this is indicative of the fact that the null position is between positions 4 and 5, and this back and forth procedure above described is continued until null is acheived.

(3) Cross-over is not achieved. The movable probe is moved further from position 2 until:

(a) null is achieved. The procedure of paragraph 1 above is then followed: or
(b) cross-over is achieved. The procedure of paragraph 2 above is then followed.

The null position can be zeroed in on, instead of being precisely located, as follows:

To relatively closely spaced (6 to 12") cross-over positions are located using the above procedures. The null position, between the two cross-over positions, is estimated, for example, as a function of the strength of the signals indicated at the cross-over positions. Thus, assuming the signal at the first cross-over position is a short pulse having a relatively large amplitude, and the signal at the second cross-over position is the long pulse having a relatively short duration, the null position would be estimated closer to the second cross-over position than to the first cross-over position.

In all of the above cases, the perpendicular bi-sector of the line joining the stationary probe and either the located or zeroed in on null position is used to determine the position of the position of interest.

Although the disclosure describes and illustrates many embodiments of the invention, it is to be understood that the invention is not restricted to these particular embodiments, but that it extends to include variations which are within the scope of the invention as defined in the appended claims.

We claim:

1. An electrical detection system for locating a position of interest in a medium which is electrically conductive, comprising:
   an electrical signal generator having an output terminal and a reference terminal;
   a source connected to said output terminal and being disposed at a first position in said medium;
   a sink connected to said reference terminal and being disposed at a second position, spaced from said first position, in said medium;
   whereby, a signal generated by said generator flows from said source to said sink through said medium;
   at least two probes, said probes being in contact with said medium at spaced third and fourth positions therein such that said third and fourth positions are equidistantly spaced from either said first position or said second position;
   whereby, a signal generated by said signal generator will flow from said source to said probes;
   a comparator having a first input terminal and a second input terminal and an output terminal;
   display means connected to said output terminal;
   a first one of said probes being connected to said first input terminal and a second one of said probes being connected to said second input terminal;
   whereby, to compare the signal strength at said one probe with the signal strength at said second probe;
   said probes being movable to different positions in said medium to determine a cross-over position such that, at said cross-over position, the perpendicular bi-sector of the line joining the probes indicates at said point of interest by pointing in the general direction thereof.

2. A system as defined in claim 1 wherein said comparator comprises a cross-over detection circuit for detecting when the inequality of signal strengths of said probes in a first sense changes to the inequality of signal strengths of said probes in a second sense.

3. A system as defined in claim 2 wherein the output signal of said signal generator comprises a pulsed asymmetric waveform.

4. A system as defined in claim 3 wherein said probes are fixedly connected to each other and to said source, said probes being equidistantly spaced from said source.

5. A system as defined in claim 3 comprising four probes, said probes being fixedly connected in orthogonal relationship.

6. A system as defined in claim 3 and comprising a plurality of probes greater than two;
   said probes being arranged around an arc of a circle;
   said source being disposed at the center of said circle;
   said probes being fixedly connected together and to said source.

7. A system as defined in claim 6 and comprising a variable resistor connected in circuit between two of said probes.

8. A system as defined in claim 4 and comprising two additional probes;
   said two additional probes straddling said source on the bi-sector of the line which joins the probes fixedly connected to each other.

9. A method for locating a position of interest in an electrically conductive medium using a system which comprises:
   an electrical signal generator having an output terminal and a reference terminal;
   a source connected to said output terminal and being disposed at a first position in said medium;
   a sink connected to said reference terminal and being disposed at a second position, spaced from said first position, in said medium;
   whereby, a signal generated by said generator flows from said source to said sink through said medium;
   at least two probes;
   whereby, a signal generated by said signal generator will flow from said source to said probes;
   a comparator having a first input terminal and a second input terminal and an output terminal;
   display means connected to said output terminal;
   a first one of said probes being connected to said first input terminal and a second one of said probes being connected to said second input terminal;
   said method comprising:
   A. positioning said probes at a third position and a spaced fourth position respectively such that said probes are equidistantly spaced from said source or said sink, and comparing the signal strengths of said probes in said comparator;
   B. when said signal strengths of said probes are unequal in a first sense;
      i. moving at least one of said probes to new positions until a cross-over position is obtained at which the signal strengths of said probes are unequal in a second sense;
      ii. at said cross-over position constructing a perpendicular bi-sector of the line joining said probes;
      said perpendicular bi-sector indicating said position of interest by pointing in the general direction thereof.

10. A method as defined in claim 9 and including the step of generating, in said generator, a pulsed, asymmetric waveform.

11. A method as defined in claim 10 wherein both said probes are fixedly connected where both probes are moved to said new position together.

12. A method as defined in claim 11, said apparatus including a pair of additional probes positioned so as to straddle the source on the bi-sector of the line which joins said first and second probes;

and including the steps of:

comparing the signal strength receive at one of said additional probes to the signal strength received at the other one of said additional probes; and indicating which one of the additional probes has received the greatest signal strength.

13. A method for locating a position of interest in an electrically conductive medium and using a system which comprises:

an electrical signal generator having an output terminal and a reference terminal;

a source connected to said output terminal and being disposed at a first position in said medium; :

a sink connected to said reference terminal and being disposed at a second position, spaced from said first position, in said medium;

whereby, a signal generated by said generator flows from said source to said sink through said medium;

a plurality of probes arranged on the arc of a circle, sad sink being disposed at the center of said circle, said probe being fixedly connected together and to said sink;

whereby, a signal generated by said signal generator will flow from said source to said probes;

a comparator having a first input terminal and a second input terminal and an output terminal;

display means connected to said output terminal;

said method comprising:

A. connecting a set of probes to said first input terminal and said second input terminal respectively of said comparator and comparing the signal strengths of said probes in said comparator;

B. when the signal strengths of said probes are unequal in a first sense;

i. connecting further sets of probes to said first and second input terminals respectively until a cross-over set is obtained at which the signal strengths of said probes are unequal in a second sense;.

ii. constructing a perpendicular bi-sector of the line joining said cross-over set;

said perpendicular bi-sector indicating at said position of interest by pointing in the general direction thereof.

14. A method as defined in claim 12 wherein one of said probes of said set is a reference probe;

whereby, said reference probe is a part of all other sets including said cross-over set.

15. A method for locating a position of interest in an electrically conductive medium and using a system which comprises:

an electrical signal generator having an output terminal and a reference terminal;

a source connected to said output terminal and being disposed at a first position in said medium;

a sink connected to said reference terminal and being disposed at a second position, spaced from said first position, in said medium;

whereby, a signal generated by said generator flows from said source to said sink through said medium;

a plurality of probes arranged on the arc of a circle, said sink being disposed at the center of said circle, said probe being fixedly connected together and to said sink;

whereby, a signal generated by said signal generator will flow from said source to said probes;

a comparator having a first input terminal and a second input terminal and an output terminal;

display means connected to said output terminal;

said method comprising:

A. connecting a set of probes to said first input terminal and said second input terminal respectively of said comparator, and connecting a variable resistor in series between the probes of said set, and comparing the signal strength of said probes in said comparator;

B. when the signal strengths of said probes are unequal in a first sense;

i. varying the resistance until a cross-over resistance is obtained;

ii. obtaining the ratio of cross-over resistance to total resistance of said variable resistor and measuring off a portion of the same ratio as the ratio of the same ratio as the ratio of the cross-over resistance to total resistance;

iii. constructing a perpendicular bi-sector between that point on the arc and the second probe of said set of probes;

said perpendicular bi-sector indicates at said position of interest by pointing in the general direction thereof.

* * * * *